United States Patent

Charles

(10) Patent No.: US 9,099,491 B2
(45) Date of Patent: Aug. 4, 2015

(54) PROCESS FOR FABRICATING AN ENHANCEMENT MODE HETEROJUNCTION TRANSISTOR

(71) Applicant: Commissariat a l'energie atomique et aux energies alternatives, Paris (FR)

(72) Inventor: Matthew Charles, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 22 days.

(21) Appl. No.: 14/090,173

(22) Filed: Nov. 26, 2013

(65) Prior Publication Data

US 2014/0147977 A1   May 29, 2014

(30) Foreign Application Priority Data

Nov. 26, 2012   (FR) ...................... 12 61208

(51) Int. Cl.
*H01L 29/66* (2006.01)
*H01L 29/778* (2006.01)
*H01L 29/10* (2006.01)
*H01L 29/20* (2006.01)

(52) U.S. Cl.
CPC ...... *H01L 29/66462* (2013.01); *H01L 29/1029* (2013.01); *H01L 29/66431* (2013.01); *H01L 29/7787* (2013.01); *H01L 29/2003* (2013.01)

(58) Field of Classification Search
None
See application file for complete search history.

(56) References Cited

U.S. PATENT DOCUMENTS

| | | | | |
|---|---|---|---|---|
| 5,243,207 A | * | 9/1993 | Plumton et al. | 257/192 |
| 5,349,214 A | * | 9/1994 | Tehrani et al. | 257/192 |
| 6,710,379 B2 | * | 3/2004 | Wojtowicz et al. | 257/194 |
| 7,382,001 B2 | * | 6/2008 | Beach | 257/194 |
| 8,420,421 B2 | * | 4/2013 | Chang et al. | 438/38 |
| 2006/0124960 A1 | | 6/2006 | Hirose et al. | |
| 2009/0050938 A1 | | 2/2009 | Miyoshi et al. | |
| 2010/0025730 A1 | * | 2/2010 | Heikman et al. | 257/194 |
| 2012/0122281 A1 | | 5/2012 | Chang et al. | |
| 2015/0035010 A1 | * | 2/2015 | Takeuchi et al. | 257/194 |

FOREIGN PATENT DOCUMENTS

JP   WO2013122176 A1 * 8/2013 ............ H01L 21/338
WO   WO2005/070009       8/2005

OTHER PUBLICATIONS

Ducroquet et al. "Double SiGe: C diffusion barrier channel 40nm CMOS with improved short-channel performances" IEEE 17.5.1-17.5-4 (2004).

* cited by examiner

*Primary Examiner* — Andres Munoz
(74) *Attorney, Agent, or Firm* — Occhiuti & Rohlicek LLP

(57) ABSTRACT

A method for fabricating a heterojunction field-effect transistor includes implanting p-type dopants form an implanted area in a first layer of III-V semiconductor alloy, removing an upper part of the first layer and of the implanted area by maintaining vapor phase epitaxy conditions, stopping the removal when the density of the dopant at the upper face of the implanted area is maximal, forming a second layer of III-V semiconductor alloy by vapor phase epitaxy on the implanted area and on the first layer, forming a third layer of III-V semiconductor alloy by vapor phase epitaxy in order to form an electron gas layer at the interface between the third layer and the second layer, and forming a control gate on the third layer plumb with the implanted area.

15 Claims, 2 Drawing Sheets

PROCESS FOR FABRICATING AN ENHANCEMENT MODE HETEROJUNCTION TRANSISTOR

RELATED APPLICATIONS

Under 35 USC 119, this application claims the benefit of the priority date of French Patent Application 1261208, filed Nov. 26, 2012, the content of which is herein incorporated by reference.

FIELD OF DISCLOSURE

The invention relates to high-electron mobility transistors based on the presence of heterojunctions, and in particular to the fabrication of enhancement mode transistors of this type.

BACKGROUND

Higher performance is being or will be required from many current or future electronic applications, especially vehicle-borne electronics intended for cars and ground-based means of transportation, aeronautical and medical systems or in-home automation solutions, for example. These applications for the most part require high-power switches (typically switching between 500 V and several kilovolts, with currents most often between 10 and 200 A) functioning in frequency ranges often above one megahertz.

Historically, high-frequency power switches have for a long time used field-effect transistors based on a semiconductor channel, most often made of silicon. At lower frequencies, junction transistors (thyristors, etc.) are preferred because they are able to withstand higher current densities. However, because of the relatively limited breakdown voltage of each of these transistors, power applications require many transistors to be connected in series, or wider transistors to be used, thereby resulting in a higher on-resistance. These series transistors generate substantial losses, both in the steady-state and switching regimes.

An alternative for power switches, especially high-frequency power switches, is the use of high-electron mobility transistors (HEMTs), also denoted by the term hetero-structure field-effect transistors (HFETs). Such transistors include a superposition of two semiconductor layers having different bandgaps and forming a quantum well at their interface. Electrons are confined to this quantum well and form a two-dimensional electron gas. For reasons of high-voltage and temperature withstand, these transistors are chosen to have a wide bandgap.

Among wide bandgap HEMTs, transistors based on gallium nitride are very promising. The width of their bandgap results in a higher avalanche voltage, compared to conventional electronic materials (Si, SiGe, GaAs, InP), in a high carrier saturation velocity, and in good thermal and chemical stability (enabling use in extreme environments). The breakdown field of gallium nitride (GaN) may thus be higher than $3 \times 10^6$ V/cm, thereby easily allowing transistors with breakdown voltages higher than 100 V to be produced (300 nm of GaN is sufficient). In addition, such transistors allow very high current densities to be obtained with lower resistive losses because of the very high electron mobility of the interface gas.

For certain applications, especially with a view to isolating a circuit in case of a malfunction of a control system, enhancement mode transistors are used, i.e. transistors with a positive switching threshold voltage, so that the transistor remains turned off in the absence of a control signal.

Because of the intrinsically conductive nature of the electron gas layer formed between a source and drain, it is technologically easier to produce a depletion mode heterojunction transistor. However, a number of fabrication processes have been developed with a view to forming enhancement mode heterojunction transistors.

According to a first approach, a layer of binary III-nitride is produced by epitaxy, then a layer of ternary III-nitride is produced by epitaxy to form an electron gas layer at the interface between these nitrides, then a p-type dopant such as Mg is implanted into the binary layer. Once the dopant implantation has been activated, the electric field generated by the implanted area allows an insulating zone to be created vertically above it, at the interface between the binary nitride layer and the ternary nitride layer. Thus, the conduction channel in the electron gas layer is depleted until a positive threshold voltage is achieved. However, it has been observed that such implantation creates defects in the structure (above all in the channel, the on-resistance of which is then increased), and that control of the implantation is imperfect, resulting in dopants being implanted in the channel (thereby further increasing its on-resistance).

According to a second approach, document WO 2005/070009 describes a fabrication process in which:
a first GaN layer is formed by epitaxy;
a p-type dopant implanted area is formed in the first GaN layer;
a second GaN layer is formed by epitaxy on the implanted area and the first GaN layer;
an AlGaN layer is formed by epitaxy on the second GaN layer; and
a gate is formed on the AlGaN layer plumb with the implanted area.

However, the transistor thus obtained has drawbacks. Specifically, the strength of the field generated by the implanted area in the electron gas is poorly controlled. Hence, the threshold voltage of the transistor is also poorly controlled.

SUMMARY

The invention aims to solve one or more of these drawbacks. The invention thus relates to a process for fabricating a heterojunction field-effect transistor, comprising steps of:
implanting p-type dopants in order to form an implanted area in a first layer of III-V semiconductor alloy;
removing an upper part of the first layer and of the implanted area by maintaining vapor phase epitaxy conditions;
stopping the removal when the density of the dopant at the upper face of the implanted area is maximal;
forming a second layer of III-V semiconductor alloy by vapor phase epitaxy on the implanted area and the first layer;
forming a third layer of III-V semiconductor alloy by vapor phase epitaxy in order to form an electron gas layer at the interface between this third layer and the second layer; and
forming a control gate on the third layer plumb with the implanted area.

As one variant, the removal step is carried out in the presence of ammonia vapor, hydrogen or a mixture of both.

As another variant, the removal step is carried out by maintaining vapor phase epitaxy conditions for a length of time between 30 seconds and 60 minutes.

As another variant, the implanted area is formed with a thickness between 5 and 100 nm in the first layer.

As yet another variant, the removal step includes removing at least 2 nm of the upper part of the implanted area.

As one variant, the density of the dopant at the upper side of the implanted area is between 1×1018 and 1×1021 cm-3.

As another variant, the second layer is formed with a thickness between 5 and 50 nm.

As another variant, the first layer and the second layer mainly include a binary nitride alloy.

As yet another variant, the binary nitride alloy is GaN.

As one variant, the third layer mainly includes a ternary nitride alloy.

As another variant, the ternary nitride alloy is AlGaN.

As another variant, the removal step is carried out at a temperature at least equal to 800° C.

As yet another variant, the dopants of the formed implanted area are chosen from the group comprising Mg, Zn, C, and Fe.

As one variant, the dopants are implanted by ion implantation.

As another variant, the implanted area is activated at least partially during the removal step.

DESCRIPTION OF THE DRAWINGS

Other features and advantages of the invention will become more clearly apparent from the description thereof given below by way of completely non-limiting examples, and with reference to the appended drawings, in which:

FIGS. 1 to 7 are schematic cross-sectional views of a heterojunction field-effect transistor 1, during various steps of an example of a fabrication process according to the invention.

In FIG. 1, an unfinished transistor 1 is provided, comprising a substrate 2, a buffer layer 3 placed on the substrate 2, and a first layer 4 of a III-V semiconductor alloy placed on the buffer layer 3.

The substrate 2 may be an insulator, or a semiconductor such as intrinsic or doped silicon. The substrate 2 will possibly, for example, be (111)-oriented silicon. The substrate 2 may also be made of silicon carbide or sapphire. The substrate 2 may typically have a thickness of about 650 μm.

The buffer layer 3 deposited on the substrate 2 serves as an intermediary between this substrate and the first layer 4 of III-V semiconductor alloy, in order to allow lattice matching between the substrate 2 and this layer 4 and to limit mechanical stresses in this layer 4.

The layer 4 may typically have a thickness between 100 nm and 4 μm. The layer 4 may be formed by epitaxy on the buffer layer 3. The layer 4 is typically made of a III-nitride alloy, such as a binary III-nitride alloy, for example GaN.

Figure 1:
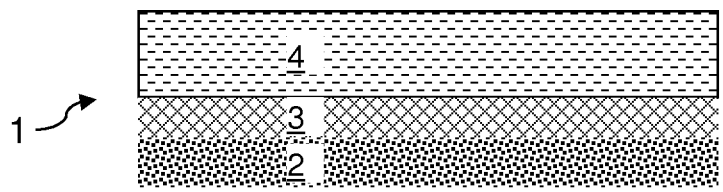
FIGS. 1 to 7 are cross-sectional views of a heterojunction field-effect transistor during various steps of an example of a fabrication process according to the invention.
Figure 2:
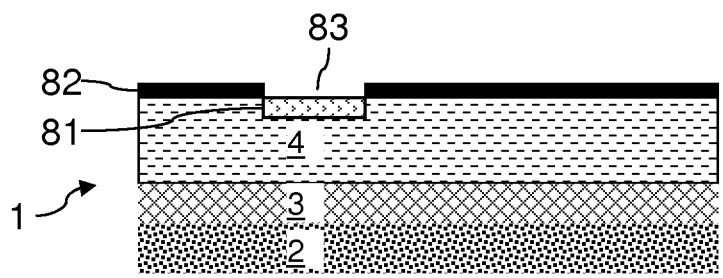

In FIG. 2, a mask 82 is formed on the layer 4. This mask 82 comprises an aperture 83. P-type dopants are implanted into the layer 4 through this aperture 83. An implanted area 81 is thus formed in the layer 4. The implantation is typically an ion implantation. The implanted area 81 thus formed advantageously has a thickness between 5 and 100 nm. The implanted area 81 will possibly have a maximal p-type dopant density between 1×10$^{18}$ and 1×10$^{21}$ cm$^{-3}$. The dopants used for the implanted area 81 will advantageously be chosen from the group containing Mg, Zn, C and Fe, with Mg preferably being used. The intrinsic p-type doping level of a GaN layer is usually about 1×1015 cm$^{-3}$.

Figure 3:
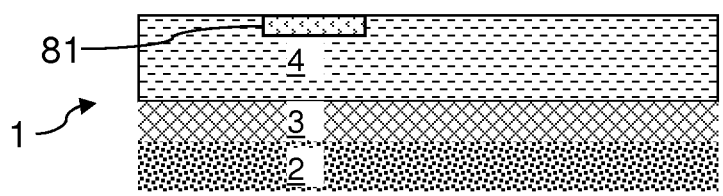

In FIG. 3, the mask 82 is removed in order to expose the upper side of the layer 4 and the implanted area 81. The unfinished element of the transistor 1 is then placed under vapor phase epitaxy conditions.

Figure 4:
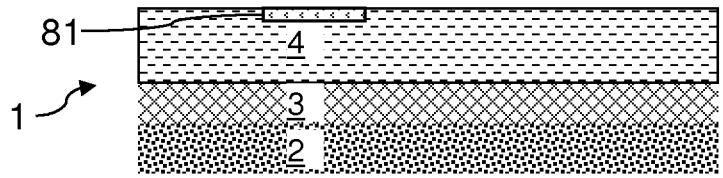

In FIG. 4, an upper part of the layer 4 and of the implanted area 81 is removed by maintaining the unfinished element of the transistor 1 under the vapor phase epitaxy conditions used to deposit this layer 4 (or the layer 6). In the absence of addition of new epitaxial materials, a gradual removal of the upper part of the layer 4 takes place. The thickness of material removed may be controlled by the length of time for which the epitaxy conditions are maintained, and by other epitaxial parameters such as temperature, or the gaseous atmosphere in which the unfinished element of the transistor 1 is placed. This removal of the upper part is stopped when the density of p-type dopants at the upper side of the implanted area 81 is maximal. Specifically, as detailed below, during implantation the implanted p-type dopant density is not maximal at the upper side of the implanted area 81, but in the depth of the latter.

Figure 8:
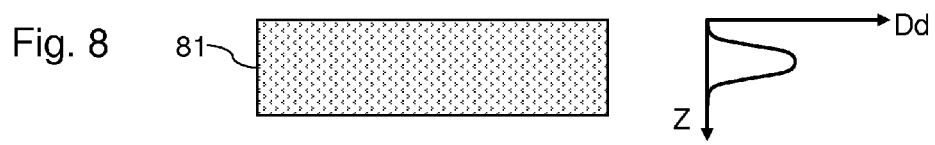
FIGS. 8 and 9 illustrate dopant density as a function of depth in an implanted area at various stages in the fabrication process.
Figure 9:
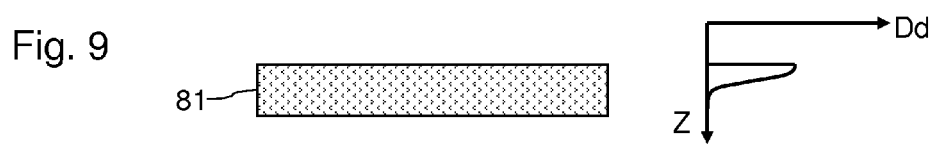

FIGS. 8 and 9 schematically illustrate the implanted area 81 and the p-type dopant density as a function of depth in this implanted area 81, after implantation and after removal, respectively.

In FIG. 8, the implanted area 81 has a Gaussian p-type dopant density distribution in its depth after implantation. In FIG. 9, an upper part of the implanted area 81 has been removed exposing a surface in which the p-type dopant density is maximal, which corresponds, in this example, to the peak of the Gaussian distribution. The p-type dopant density at the upper side of the implanted area 81 is therefore maximal.

The implantation creates, for example, an implanted area 81 having a Gaussian dopant density distribution along its depth. Other implantation density profiles may be obtained depending on the parameters of the implantation process. The depth to which the removal of the upper part of the implanted area 81 extends is determined by the parameters of the implantation. Specifically, the implantation parameters may be used to set the depth in the implanted area 81 at which the implantation creates a maximal dopant density. The implantation parameters will possibly, for example, be defined so that the maximal dopant density is located at a depth of 10 nm in the implanted area 81. The step of maintaining the vapor phase epitaxy conditions will advantageously be carried out for a length of time between 30 seconds and 60 minutes, for example at a temperature of 1050° C., for example in the presence of ammonia and/or hydrogen. Typically, at least 2 nm of the upper part of the implanted area 81 is removed. The removal step may serve, at least partially, as an annealing step for activating the implanted dopants, and to remove certain impurities located on the surface of the layer 4.

Figure 5:
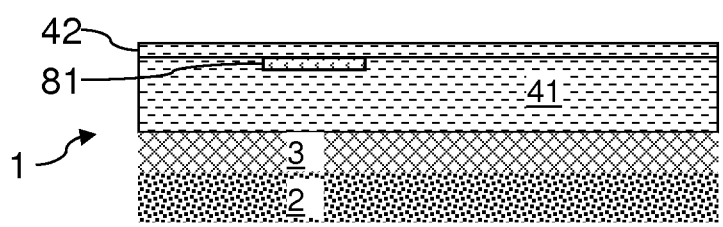

After the removal, the layer 4 forms a lower semiconductor layer 41. In FIG. 5, a second layer 42 of III-V semiconductor alloy is formed on the implanted area 81 and on the lower layer 41 by vapor phase epitaxy. The deposition of the layer 42 is typically a wafer-scale deposition. The deposition of the layer 42 may be carried out in the same machine as the removal step, immediately after this removal step. Moreover, because the upper part of the first layer 41 is removed by maintaining it under epitaxy conditions, the upper side of this first layer 41 is particularly suitable for growing the second layer 42 by epitaxy with an optimal quality. Thus, the interface on which the layer 42 is formed is free from undesirable impurities or modifications.

The layer 42 may be made of the same material (for example a III-nitride alloy) as the layer 41, in order to promote defectless epitaxy of this layer 42, and to prevent undesirable effects on the operation of the transistor 1. The thickness of the deposition of the layer 42 is advantageously between 5 and 50 nm. The thickness of the deposition of the layer 42 is very well controlled by way of a vapor phase epitaxy deposition process. Via this control of the thickness of the layer 42, which ensures the precision of the electric field generated by the implanted area 81 in the future electron gas layer, the precision of the control of the threshold voltage of the transistor 1 is guaranteed.

Figure 6:
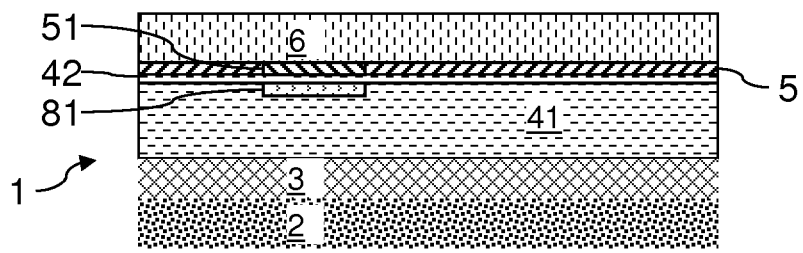

In FIG. 6, a layer 6 of a III-V semiconductor alloy is formed by vapor phase epitaxy on the second layer 42 in order to form an electron gas at the interface between the layer 6 and the layer 42. For the sake of legibility, the electron gas is illustrated as a layer 5 at the interface between the layer 42 and the layer 6. The layer 6 is generally referred to as the barrier layer. The layer 6 is typically a III-V semiconductor alloy, such as a ternary III-nitride alloy, for example AlGaN, or a binary III-nitride alloy, for example AlN. A layer 6 made of AlGaN is particularly appropriate for a layer 42 made of GaN since formation of the layer 6 by epitaxy is then achieved simply by maintaining the unfinished transistor 1 in the same machine and carrying out an epitaxial deposition under the conditions used for the layer 42 but with introduction of the aluminum precursor. Although not illustrated, the layer 6 may comprise a 1 to 3 nm-thick layer of a binary III-nitride alloy formed on the layer 42, this layer of binary alloy being covered with another layer of ternary III-nitride alloy.

An insulating zone 51 is formed in the layer 5, plumb with the implanted area 81. This zone 51 is made insulating by the presence of the electric field generated by the p-type dopants of the implanted area 81. The transistor 1 is therefore turned off in the absence of a control signal applied to the gate.

The epitaxial deposition process used to form the second layer 42 and the third layer 6 may typically be a hydride vapor phase epitaxy (HVPE) or metal organic chemical vapor deposition (MOCVD) epitaxial process. These processes are typically carried out in the presence of ammonia vapor or hydrogen, or a mixture of both. When the unfinished transistor 1 is maintained under such epitaxy conditions, in the absence of addition of new epitaxial materials, removal of the upper part of the first layer 4 gradually takes place via sublimation of the material of this layer. The epitaxy conditions will be adapted to the semiconductors making up the layers 4 and 6 so that these conditions facilitate the removal step. For a nitride layer 4, the temperature of these epitaxy conditions will typically be above 800° C., or even above 900° C. For a layer 4 made of another type of III-V semiconductor, such as GaAs or InP, the epitaxy temperature will typically be above 500° C. The higher the temperature of the epitaxy conditions, the higher the removal rate.

It will furthermore be noted that the epitaxy conditions of the layers 42 and 6 allow the implanted area 81 to be activated. The activation anneal of the dopants of the implanted area 81 is generally carried out at a temperature between 800° C. and 1500° C. for the nitrides (between 500° C. and 900° C. for other types of III-V semiconductors), with an anneal time that depends on this temperature. Thus, it is not necessary to carry out an additional activation of the implanted area 81 after the electron gas layer 5 has been formed. Thus, an additional anneal, which is a factor contributing to the degradation of the unfinished transistor 1, is avoided.

Figure 7:
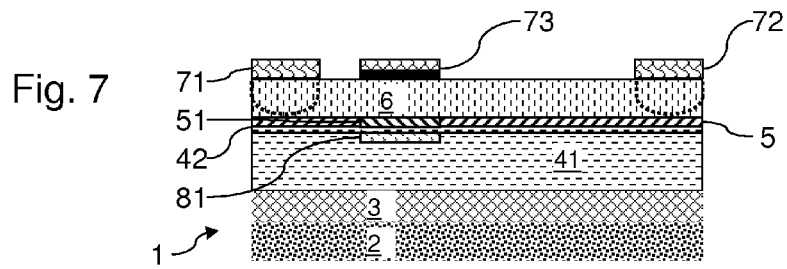

In FIG. 7, a source 71, a drain 72, and a control gate 73 of the transistor 1 are produced on the layer 6. The gate 73 is formed plumb with the implanted area 81. The gate 73 advantageously protrudes laterally relative to the implanted area in order to guarantee that the transistor 1 can be controlled in the event that the gate 73 is misaligned during the fabrication process. The transistor 1 thus formed is therefore an enhancement mode transistor, the zone 51 plumb with the gate 73 being insulating in the absence of application of an appropriate electric field by the gate 73. The influence of the implanted area 81 on the zone 51 is optimal because the density of p-type dopants at its upper side is maximal, and the control of the threshold voltage of the transistor 1 is particularly precise due to the control of the distance between this upper side and the zone 51. The effectiveness of the use of p-type dopants is therefore optimized. A very steep implantation profile may be used, thereby reducing the amount of dopants required or allowing the thickness of the channel to be increased for a given threshold voltage (the on-resistance of the zone 15 thus being decreased).

Relative to a process implementing implantation through the electron gas layer, electron mobility in the zone 51 is increased, and the on-resistance of the transistor 1 in the on-state is reduced.

Figure 10:
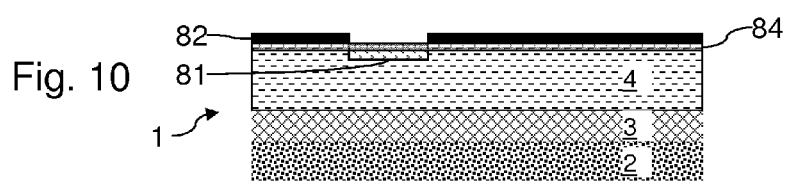
FIG. 10 illustrates a step of a variant fabrication process according to the invention.

FIG. 10 is a schematic cross-sectional view of an unfinished transistor 1 after the implanted area 81 has been formed by means of a mask 82, according to one variant of the fabrication process. A sacrificial layer 84 is deposited on the layer 4 before the mask 82 is formed. The sacrificial layer 84 is made of a different material to the layer 4. Therefore, the mask 82 is formed on the sacrificial layer 84. The implanted area 81 is therefore formed by ion implantation into the sacrificial layer 84 and into the layer 4. The sacrificial layer 84 may, for example, be a metal layer or a silicon-oxide layer.

Figure 11:
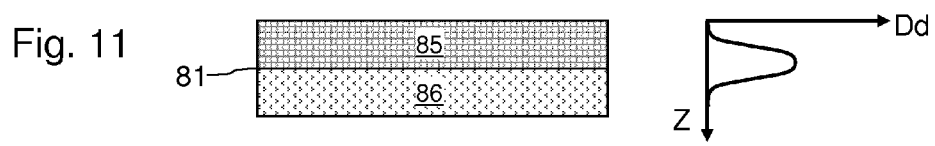
FIGS. 11 and 12 illustrate dopant density as a function of depth in an implanted area at various stages in the fabrication process of the process of FIG. 10.

The sacrificial layer 84 is deposited so that its thickness corresponds to the implantation depth at which a peak p-type dopant density is obtained for the implanted area 81, as illustrated in the example in FIG. 11. FIG. 11 illustrates an enlarged cross section of the implantation in FIG. 10, one part 85 of the implantation being formed in the sacrificial layer 84, the other part 86 of the implantation being formed in the layer 4. A sacrificial layer 84 made of a material that is gradually removed when maintained under epitaxial conditions is used.

Figure 12:
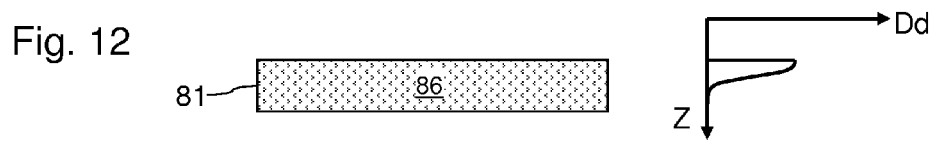

As illustrated in FIG. 12, removal of the sacrificial layer 84 continues until the interface between the sacrificial layer 84 and the layer 4, at which interface the dopant density is optimal, is reached. This removal is carried out gradually by maintaining the unfinished element of the transistor 1 under epitaxy conditions. The implanted area 81 obtained in FIG. 12 therefore has an optimal p-type dopant density.

An appropriate metal may be chosen for the material of the sacrificial layer 84 so that ions of this metal migrate into the layer 4 during the implantation, in order to form additional p-type dopants. These ions may be activated in the layer 4 during the same annealing step used to activate the implanted p-type dopants.

The variant described with reference to FIGS. 1 to 9 will generally be preferred since with this variant there is less risk of introducing undesirable elements into the layers 4 and 6.

In the examples described above, the layers 4 and 6 are made of III-nitrides. Other semiconductor alloys chosen from the III-V semiconductor alloys may also be used for layers 4 and 6. It may, for example, be envisaged to form the layers 4 or 6 from InP or GaAs.

It is also possible to adapt the fabrication process to a first semiconductor layer 4 made of silicon-germanium. Thus, it is possible to implant p-type dopants in such a layer, and then remove a top part of this layer by maintaining it under vapor phase epitaxy conditions.

What is claimed is:

1. A method for fabricating a heterojunction field-effect transistor, said method comprising:
    implanting p-type dopants in order to form an implanted area in a first layer of a III-V semiconductor alloy,
    removing an upper part of said first layer and of said implanted area by maintaining vapor phase epitaxy conditions,
    stopping said removing when a density of said p-type dopants at an uppermost face of said implanted area is maximal,
    forming a second layer of a III-V semiconductor alloy by vapor phase epitaxy on said implanted area and on said first layer,
    forming a third layer of a III-V semiconductor alloy by vapor phase epitaxy in order to form an electron gas layer at an interface between said third layer and said second layer, and
    forming a control gate on said third layer plumb with said implanted area.

2. The method of claim 1, wherein removing an upper part of said first layer and of said implanted area comprises removing in the presence of matter selected from the group consisting of ammonia vapor, hydrogen, and a mixture of ammonia vapor and hydrogen.

3. The method of claim 1, wherein removing an upper part of said first layer and of said implanted area comprises maintaining vapor phase epitaxy conditions for a length of time between 30 seconds and 60 minutes.

4. The method of claim 1, wherein implanting p-type dopants in order to form an implanted area comprises forming said implanted area having a thickness between 5 nm and 100 nm in said first layer.

5. The method of claim 4, wherein said removing includes removing at least 2 nm of said upper part of said implanted area.

6. The method of claim 1, further comprising causing a said density of said p-type dopants at said uppermost face of said implanted area to be between $1 \times 10^{18}$ and $10^{21}$ cm$^{-3}$.

7. The method of claim 1, wherein forming a second layer comprises forming said second layer having a thickness between 5 nm and 50 nm.

8. The method of claim 1, further comprising causing said first layer and said second layer to comprise primarily a binary III-nitride alloy.

9. The method of claim 8, further comprising selecting said binary III-nitride alloy to be GaN.

10. The method of claim 8, wherein further comprising causing said removing to be carried out at a temperature at least equal to 800° C.

11. The method of claim 1, further comprising causing said third layer to comprise primarily a ternary III-nitride alloy.

12. The method of claim 11, further comprising selecting said ternary III-nitride alloy to be AlGaN.

13. The method of claim 1, further comprising selecting said p-type dopants of said implanted area from the group consisting of Mg, Zn, C, and Fe.

14. The method of claim 1, wherein implanting said p-type dopants comprises implanting by ion implantation.

15. The method of claim 1, further comprising causing an activation of said p-type dopants of said implanted area at least partially during said removing.

* * * * *